(12) United States Patent
Breitwisch et al.

(10) Patent No.: US 7,190,007 B2
(45) Date of Patent: Mar. 13, 2007

(54) ISOLATED FULLY DEPLETED SILICON-ON-INSULATOR REGIONS BY SELECTIVE ETCH

(75) Inventors: Matthew J. Breitwisch, Essex Junction, VT (US); Chung H. Lam, Williston, VT (US); Randy W. Mann, Williston, VT (US); Dale W. Martin, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 203 days.

(21) Appl. No.: 10/710,821

(22) Filed: Aug. 5, 2004

(65) Prior Publication Data
US 2006/0027889 A1    Feb. 9, 2006

(51) Int. Cl.
*H01L 29/47* (2006.01)
(52) U.S. Cl. .................. 257/149; 257/311; 257/479
(58) Field of Classification Search ............. 438/517, 438/479, 149, 311
See application file for complete search history.

(56) References Cited

U.S. PATENT DOCUMENTS

| | | | |
|---|---|---|---|
| 5,306,659 A | 4/1994 | Beyer et al. | |
| 5,324,683 A | 6/1994 | Fitch et al. | |
| 5,391,911 A | 2/1995 | Beyer et al. | |
| 6,020,250 A | 2/2000 | Kenney | |
| 6,492,705 B1 | 12/2002 | Begley et al. | |

FOREIGN PATENT DOCUMENTS

JP    7007075 A    10/1995

OTHER PUBLICATIONS

M.Q. Huda, et al., "Technique for Large Elevation of Source/Drain Using Implantation Mediated Selective Etching", *Electrochemical and Solid-State Letters*, pp. G117-G118 (2003).

*Primary Examiner*—Douglas W. Owens
(74) *Attorney, Agent, or Firm*—Scully, Scott, Murphy & Presser, P.C.; William D. Sabo, Esq.

(57) ABSTRACT

The present invention provides a method of forming an ultra-thin and uniform layer of Si including the steps of providing a substrate having semiconducting regions separated by insulating regions; implanting dopants into the substrate to provide an etch differential doped portion in the semiconducting regions underlying an upper Si-containing surface of the semiconducting regions; forming a trench in the substrate including the semiconducting regions and the insulating regions; removing the etch differential doped portion from the semiconductor regions to produce a cavity underlying the upper surface of the semiconducting regions; and filling the trench with a trench dielectric, wherein the trench dielectric material encloses the cavity underlying the upper Si-containing surface of the semiconducting regions. The upper Si-containing surface of the semiconducting regions has a uniform thickness of less than about 100 Å.

17 Claims, 3 Drawing Sheets

ISOLATED FULLY DEPLETED SILICON-ON-INSULATOR REGIONS BY SELECTIVE ETCH

BACKGROUND ART

1. Field of the Invention

The invention relates generally to semiconductor substrate manufacturing, and more particularly to a method of forming an ultra-thin and uniform layer of Si atop an isolation region.

2. Background of the Invention

In semiconductor processing, silicon-on-insulator (SOI) technology is becoming increasingly important since it permits the formation of high-speed integrated circuits. In SOI technology, a buried insulating layer electrically isolates a top Si-containing layer from a bottom Si-containing layer. The top Si-containing layer, which is oftentimes referred to in the art as the SOI layer, is generally the area in which active devices such as transistors are formed. Devices formed using SOI technology offer many advantages over their bulk Si counterparts including, for example, higher performance, absence of latch-up, higher packing density and low voltage applications.

In the semiconductor industry, the SOI thickness has been scaled down in every SOI device technology generation. Current technology trends are for providing SOI devices that have thin Si channels. Thin Si channel devices, which are formed in the top Si-containing layer of an SOI substrate, have demonstrated excellent scalability.

Previously, thin Si-containing layers have been formed using conventional layer transfer or oxygen ion implantation. Oxygen implantation creates high internal stresses, which can disadvantageously result in dislocation formation that reduces device performance. Oxygen implantation also disadvantageously requires a very high temperature anneal, wherein the annealing temperature may be on the order of 1100° C. or higher. Si-containing layer formation via layer transfer cannot be selectively applied to specific regions, since layer transfer disadvantageously affects the entire surface of the substrate. Therefore, prior layer transfer methods cannot be easily integrated into forming substrates that simultaneously comprise SOI and bulk-Si portions.

Prior processing methods for forming thin layers of Si have difficulties forming a uniform and ultra-thin layer of Si on an isolation region. The term "uniform" is meant to denote that the thickness of the ultra-thin Si layer is substantially constant and continuous. The term "ultra-thin" is used throughout this application to denote a Si-containing layer having a vertical thickness that is thin enough to be fully depleted when a field effect transistor is formed on top of the Si-containing layer. The term "fully depleted" denotes that the Si-containing layer is fully depleted of mobile charge carriers when an off voltage is applied to the gate region of a field effect transistor (FET), which is positioned on the Si-containing layer.

In view of the state of the art mentioned above, there is a continued need for providing a method of forming a uniform and ultra-thin layer of Si atop an insulating region, wherein the ultra-thin Si layer has a thickness that fully depletes when employed as the channel of a FET device.

SUMMARY OF THE INVENTION

One object of the present invention is to provide a method of forming a uniform and ultra-thin Si layer atop an insulating region. Another object of the present invention is to provide a method of forming a uniform ultra-thin Si layer atop an insulating region, wherein the ultra-thin Si layer has a thickness that fully depletes when employed as the channel of an FET device. A yet further object of the present invention is to provide a method of forming a uniform and ultra-thin Si layer atop an insulating region in a SOI portion of the substrate, where another portion of the substrate is bulk-Si.

These and other objects and advantages are achieved in the present invention by a method of forming an isolated ultra-thin layer of Si with precise control of the Si layer thickness. Broadly, the inventive method comprises the steps of:

providing a substrate having semiconducting regions separated by insulating regions;

implanting dopants into said substrate to provide an etch differential doped portion in said semiconducting regions underlying an upper Si-containing surface of said semiconducting regions;

forming a trench in said substrate including said semiconducting regions and said insulating regions;

removing said etch differential doped portion from said semiconducting regions to produce a cavity underlying said upper Si-containing surface of said semiconducting regions;

passivating exposed Si-containing surfaces underlying said upper Si-containing surface of said semiconducting regions, wherein said exposed Si-containing surfaces underlying said upper Si-containing surface are formed by said cavity; and filling said trench with a trench dielectric, wherein said trench dielectric encloses said cavity underlying said upper Si-containing surface of said semiconducting regions.

The upper Si-containing surface of said semiconducting regions may have any thickness, but preferably has a uniform thickness of less than about 100 Å.

The substrate having semiconducting regions separated by insulating regions may be provided using deposition and photolithography processes. Specifically, an etch mask may be utilized to define the semiconducting regions. The portions of the substrate exposed by the etch mask are then etched and filled to provide insulating regions.

The etch differential doped portion of the semiconductor regions may be formed by implanting an etch differential dopant, such as argon (Ar) or hydrogen (H), into the semiconducting regions. The etch differential dopant may be selectively implanted into the substrate using a block mask, in which the portions of the substrate protected by the block mask provides bulk-Si regions and the implanted portions of the substrate provide SOI regions.

The etch differential doped region may be removed using a highly selective etch process that can comprise $HF:HNO_3:CH_3COOH$, ethylenediamine-pyrocatechol-water, KOH, a mixture of $NH_4OH/H_2O_2/H_2O$, a mixture of $HCl/H_2O_2/H_2O$ or combinations thereof.

A passivation layer can then be formed underlying the upper Si-containing surface of the semiconducting regions. The passivation layer may comprise an oxide, such as $SiO_2$ The passivation layer underlying the upper Si-containing surface is formed via thermal oxidation.

Another aspect of the present invention is the structure produced by the above-described method, in which a uniform and ultra-thin Si-containing layer is provided. Broadly, the inventive semiconducting structure comprises
at least two insulating pillars atop a substrate;
a layer of Si bridging said at least two insulating pillars; and a cavity between each of said two insulating pillars and underlying said layer of Si, wherein said layer of Si has a uniform thickness of about 10 nm or less.

DISCLOSURE OF INVENTION

Figure 1:
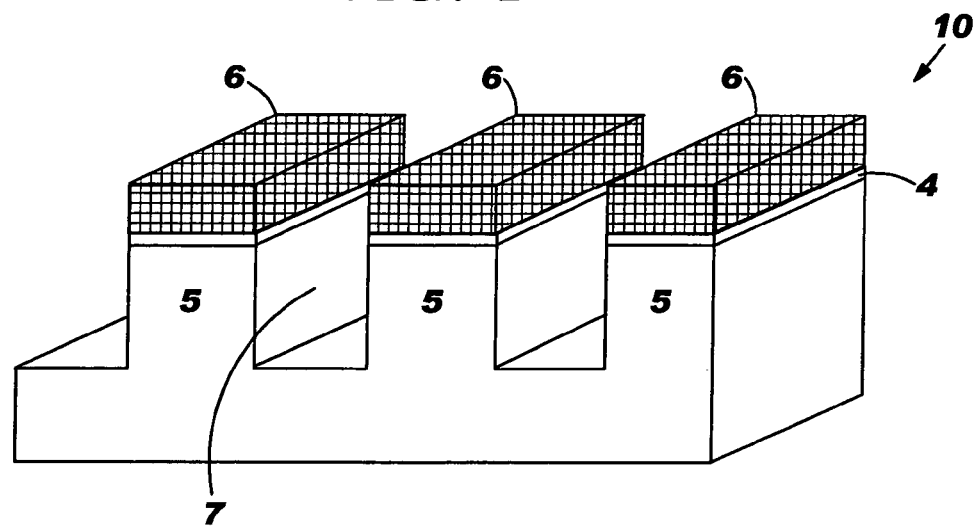
FIG. 1 is a pictorial representation (through a three dimensional perspective view) illustrating the initial process steps of the inventive method.

The present invention, which provides a method of forming an ultra-thin and uniform layer of Si atop an isolation region, will now be described in greater detail by referring to the drawings that accompany the present application. It is noted that in the accompanying drawings like and/or corresponding elements are referred to by like reference numbers.

Reference is first made to the initial structure shown in FIG. 1. The initial structure comprises a substrate 10 having semiconductor regions 5, which are formed using deposition, photolithography, and etching.

The substrate 10 includes, but is not limited to: any semiconducting material such as conventional Si-containing materials and other like semiconductors. The term "Si-containing material" is used herein to denote a material that includes silicon. Illustrative examples of Si-containing materials include, but are not limited to: Si, SiGe, SiGeC, SiC, polysilicon, i.e., polySi, epitaxial silicon, i.e., epi-Si, amorphous Si, i.e., a:Si and multilayers thereof. A preferred Si-containing material of the substrate 10 is Si. A polish stop layer 4 may be deposited atop the substrate 10, in which the polish stop layer 4 functions as a stop layer during subsequent chemical mechanical planarization (CMP) processes. The polish stop layer 4 is typically a nitride, such as $Si_3N_4$, and may have a thickness on the order of about 80 nm.

The semiconducting regions 5 may be formed in the substrate 10 utilizing photolithography and etching. In a first process step, a photoresist mask 6 is formed overlying the portions of the substrate 10 that will subsequently form the semiconducting regions 5. Specifically, the photoresist mask 6 is formed by depositing a layer of photoresist atop the surface of the polish stop layer 4 or directly atop the surface of the substrate 10; exposing the layer of photoresist to a pattern of radiation; and then developing the pattern into the photoresist layer utilizing a conventional resist developer.

Once the patterning of the photoresist is completed, the sections covered by the photoresist mask 6 are protected, while the exposed regions are removed using a selective etching process that removes the unprotected regions of the substrate 10 to produce isolation trenches 7 and define the semiconducting portions 5. The selective etch process may comprise a dry etching process, such as reactive-ion etching (RIE), plasma etching, ion beam, or laser ablation. The etch process may be timed.

Figure 2:
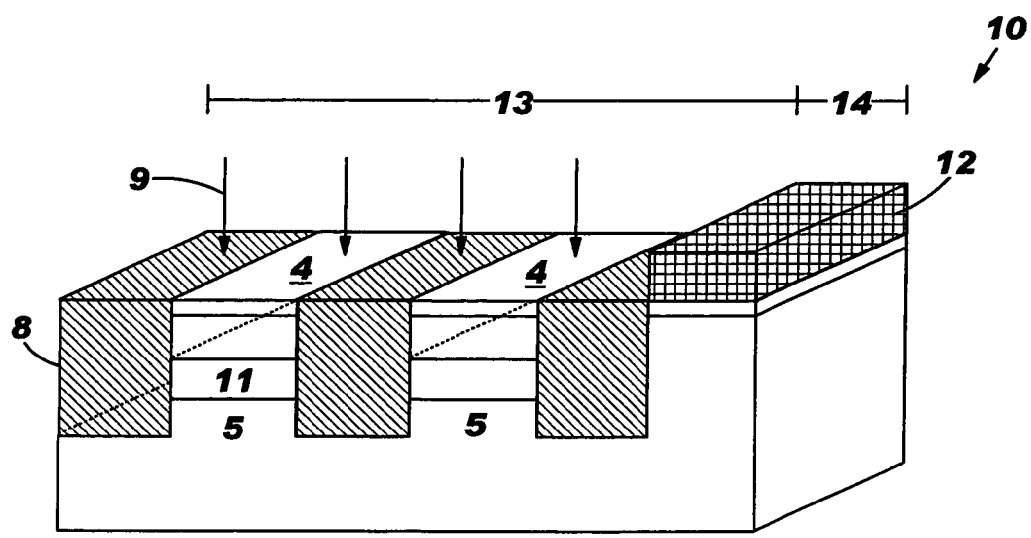
FIG. 2 is pictorial representations (through a three dimensional perspective view) illustrating implantation of etch differential dopant into the substrate of one embodiment of the invention.

Referring to FIG. 2, in a next process step, the isolation trenches may optionally be lined with a conventional liner material, and then CVD or another like deposition process is used to fill the trench with an oxide or another like trench dielectric to form the insulating regions 8. In a preferred embodiment, the trench dielectric is $SiO_2$. The trench dielectric may optionally be densified after deposition. A conventional planarization process such as chemical-mechanical polishing (CMP) may optionally be used to provide a planar structure. A chemical strip is used to remove the photoresist mask 6.

Still referring to FIG. 2, an etch differential dopant is then implanted 9 into the substrate 10 using ion implantation. Prior to implant 9, a block mask 12 can be formed to selectively implant the substrate 10, in which the implanted region 11 provides an SOI portion 13 of the substrate 10 and the portion of the substrate protected by the block mask 12 provides a bulk-Si portion 14. The block mask 12 can comprise a photoresist and may be formed using conventional deposition and photolithography. Following implantation, the block mask 12 may be removed using a chemical photoresist strip. The block mask 12 may be omitted.

The etch differential dopant may comprise Ar, As, P, B or H. The etch differential dopant is preferably Ar or H. In one highly preferred embodiment of the present invention, the etch differential dopant is Ar. In this embodiment, Ar is implanted using an implant energy ranging from about 80 keV to about 100 keV and an implant concentration ranging from about $1\times10^{14}$ atoms/cm$^2$ to about $1\times10^{15}$ atoms/cm$^2$. In another embodiment of the present invention, the etch differential dopant is H. In this embodiment, H is implanted using an implant energy ranging from about 5 keV to about 10 keV and an implant concentration ranging from about $1\times10^{16}$ atoms/cm$^2$ to about $1\times10^{17}$ atoms/cm$^2$. During subsequent etching, the implant region 11 in the semiconducting regions 5 of the substrate 10 containing etch differential dopant will be selectively etched at a faster rate than the non-doped regions of the substrate 10.

Figure 3:
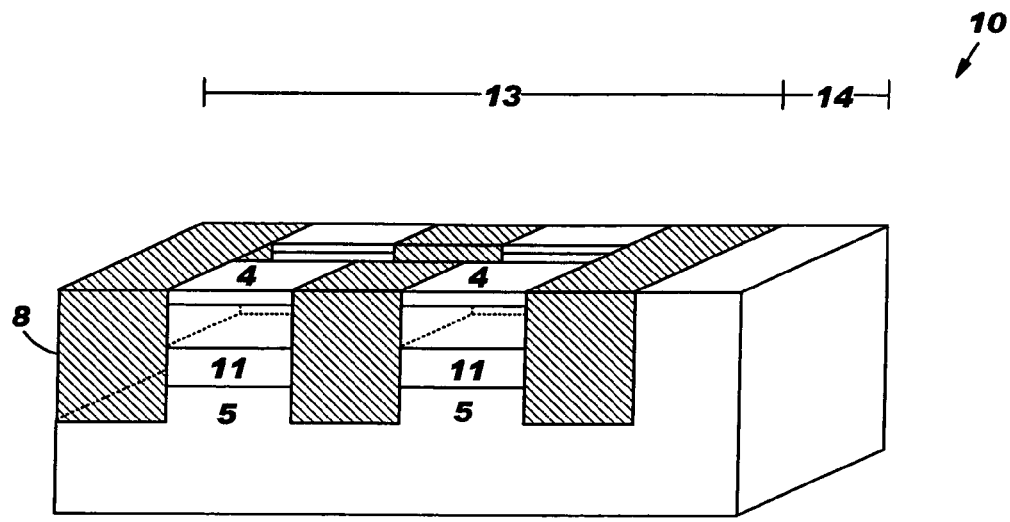
FIG. 3 is a pictorial representation (through a three dimensional perspective view) of a trench defined by the trench patterned photoresist mask depicted in FIG. 4.

Referring to FIG. 3, a trench 15 is then formed within a portion of the substrate 10 including a portion of the semiconducting region 5 and the insulating region 8. The trench 15 is defined using a trench patterned photoresist mask and a selective etch process.

Figure 4:
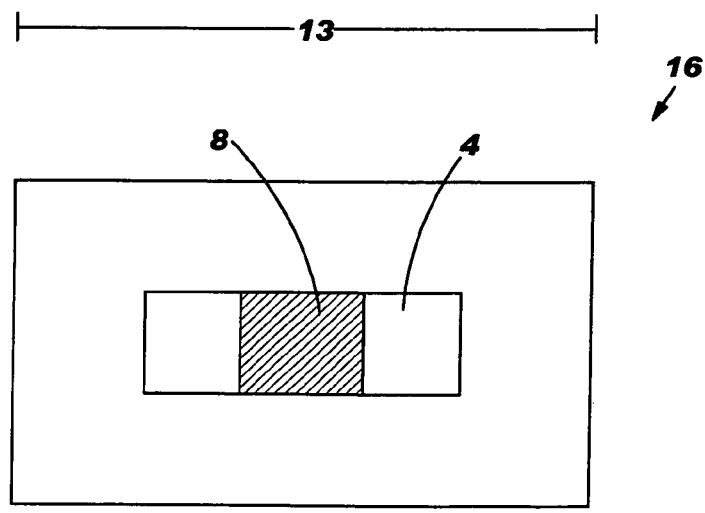
FIG. 4 is a pictorial representation (through top elevational view) of a trench etch mask formed atop the region of the structure in which the etch differential dopant is present.

Referring to FIG. 4, the trench patterned photoresist mask 16 is formed atop the surface of the polish stop layer 4 or the surface of the substrate 10, including the SOI region 13 and the bulk-Si region (note depicted in FIG. 4). The trench patterned photoresist mask 16 exposes the portions of the insulating regions 8 and the semiconducting regions 5 in which the trench 15 is subsequently formed. Conventional deposition and photolithography form the trench patterned photoresist mask 16.

The exposed portions of the insulating regions 8, the polish stop layer 4 and the semiconducting regions 5 are then removed using an etch process having a high selectivity for removing the exposed insulating regions 8, polish stop layer 4 and semiconducting regions 5 without etching the trench patterned photoresist mask 16. Following the formation of the trench 15, the trench patterned photoresist mask 16 is removed using a chemical strip.

Figure 5:
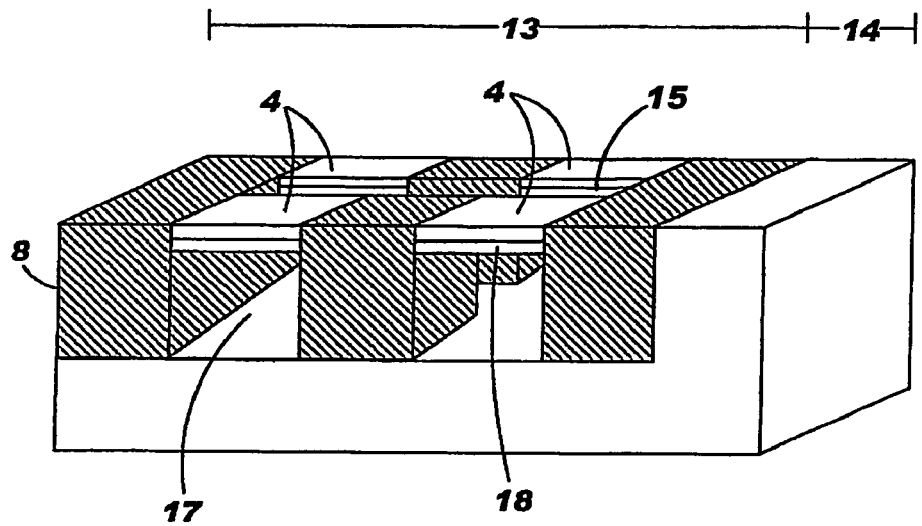
FIG. 5 illustrates (through a three dimensional perspective view) the resultant structure following removal of the etch differential doped regions.

Referring to FIG. 5 in a next process step, the implanted region 11 of the semiconducting regions 5 is removed using a selective etch process having a higher selectively for removing the implant region 11 of the semiconducting region 6. The selective etch process preferably comprises a wet dip, in which the chemistry of the dip is selected to remove the etch differential dopant of the implant region 11.

In the embodiment of the invention in which Ar is the etch differential dopant, the etch process may comprise $HF:HNO_3:CH_3COOH$ (1:80:120) or ethylenediamine-pyrocatechol-water. The duration of the etch is dependent on the width of the cavity measured between the exposed edges of the Si region. The width can be limited by design rule to less than 500 nm. The differential etch rate is greater than 10:1 with Ar implanted Si etching typically at about 50 nm/min. In the embodiment of the invention in which H is the etch differential dopant, the etch process may comprise KOH, diluted in isopropanol (IPA). The differential etch rate is greater than 10:1. The etch rates can be adjusted to a wide range dependent on IPA dilution of the KOH solution. For 100 KOH: 25 IPA, the non-implanted Si etch rate is about 60 nm/min.

Still referring to FIG. 5, removing the implanted region 11 of the semiconducting regions 5 produces cavities 17 under the remaining portions of the semiconducting regions 18. The remaining portion of the semiconducting region 18 may be a Si-containing layer having a uniform thickness of less than 1000 Å, preferably less than 300 Å, and even more preferably less than 100 Å. The remaining portion of the semiconducting region 18 is hereafter referred to as the uniform and ultra-thin Si-containing layer 18.

Figure 6:
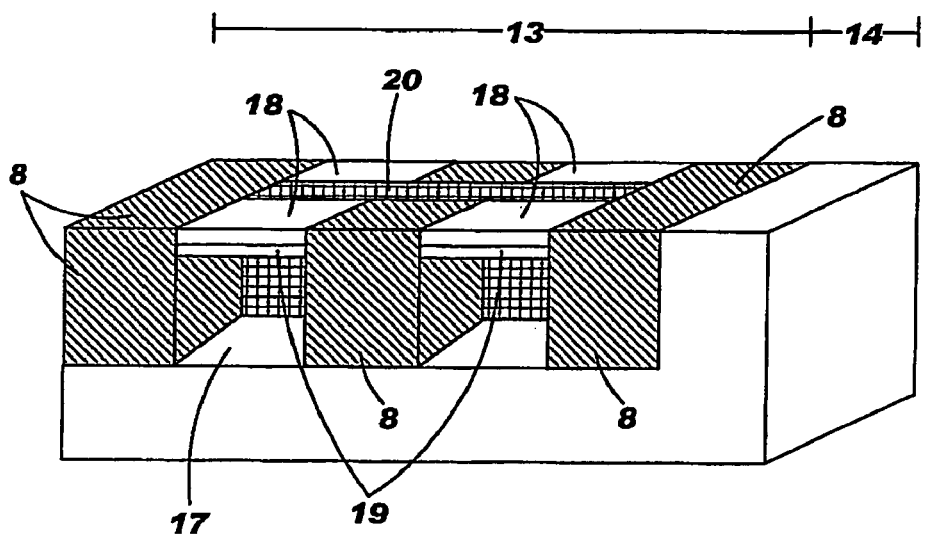
FIG. 6 illustrates (through a three dimensional perspective view) the structure depicted in FIG. 5 further comprising a trench dielectric fill and a passivation layer underlying each ultra-thin and uniform Si-containing layer.

Referring to FIG. 6, the substrate 10 is then annealed in an oxidizing atmosphere to form a passivation layer 19 underlying the uniform and ultra-thin Si-containing layer 18. The passivation layer 19 is preferably an oxide, such as $SiO_2$, and has a thickness ranging from about 30 Å to about 100 Å, more preferably being 100 Å. The passivation layer 19 is formed by an oxidizing anneal having a temperature ranging from about 800° C. to about 1000° C. The anneal is performed for a time period ranging from about 30 seconds for rapid thermal annealing (RTA) to about 1 hour for furnace annealing. The passivation layer 19 advantageously reduces the occurrence of leakage effects in devices that are subsequently formed atop the uniform and ultra-thin Si-containing layer 18.

Still referring to FIG. 6, a trench dielectric 20 is then deposited within the trench 15 enclosing the cavity 17 positioned underlying the uniform and ultra-thin Si-containing layer 18. The trench dielectric 20 may comprise oxides, nitrides, or oxynitrides, so long as the material may be deposited by plasma enhanced chemical vapor deposition (PECVD) or high-density plasma deposition (HDPCVD). PECVD and HDPCVD are non-conformal deposition processes. The rate of deposition by HDPCVD or PECVD is substantially higher on the surfaces directly exposed to plasma ions. Therefore, HDPCVD or PECVD oxide grows from the bottom up in narrow apertures. Filling the trench 15 with oxide deposited by PECVD or HDCVD does not fill the cavity 17 underlying the uniform and ultra-thin Si-containing layer 18. The oxide is chemical mechanically polished (CMP) stopping on the polish stop layer 4. The structure is then cleaned and the polish stop layer is removed by a hot phosphorus solution. The resultant structure comprises an enclosed cavity 17 of gas (air) underlying the uniform and ultra-thin Si-containing layer 18.

The SOI portion 13 of the substrate 10 can then be processed to provide SOI devices using conventional semiconducting manufacturing methods that are well known within the skill of the art. Examples of SOI devices include field effect transistors, such as complimentary metal oxide semiconductor field effect transistors (MOSFETs), and bipolar transistors, such as lateral NPN or PNP transistors. The bulk-Si portion 14 of the substrate 10 can be processed to provide bulk-Si devices using conventional manufacturing methods that are well known within the skill of the art. Examples of bulk-Si devices include vertical memory devices, such as Dynamic Random Access Memory (DRAM) and Flash memory.

While the present invention has been particularly shown and described with respect to preferred embodiments thereof, it will be understood by those skilled in the art that the foregoing and other changes in forms and details may be made with departing from the spirit and scope of the present invention. It is therefore intended that the present invention not be limited to the exact forms and details described and illustrated, but fall within the scope of the appended claims

The invention claimed is:

1. A method of forming a layer of Si comprising:
   providing a substrate having semiconducting regions separated by insulating regions;
   implanting dopants into said substrate to provide an etch differential doped portion in said semiconducting regions underlying an upper Si-containing surface of said semiconducting regions;
   forming a trench in said substrate including portions of said semiconducting regions and said insulating regions;
   removing said etch differential doped portion from said semiconducting regions to produce a cavity underlying said upper Si-containing surface of said semiconducting regions;
   passivating exposed Si-containing surfaces underlying said upper Si-containing surface of said semiconducting regions, wherein said exposed Si-containing surfaces underlying said upper Si-containing surface are formed by said cavity; and
   filling said trench with a trench dielectric, wherein said dielectric material encloses said cavity underlying said upper Si-containing surface of said semiconducting regions.

2. The method of claim 1 wherein said upper Si-containing surface of said semiconducting regions has a uniform thickness of less than about 100 Å.

3. The method of claim 1 wherein said providing a semiconducting substrate having semiconducting regions separated by insulating regions comprises:
   forming an etch mask protecting a portion of said substrate, wherein an exposed portion of said substrate is unprotected;
   etching said exposed portion of said substrate to form isolation regions, wherein a remaining portion of said substrate forms said semiconducting regions; and
   depositing insulating material within said isolation regions to form insulating regions.

4. The method of claim 3 wherein said insulating material is an oxide, nitride, or oxynitride deposited using chemical vapor deposition.

5. The method of claim 1 wherein said implanting dopants into said semiconducting regions comprises ion implanting an etch differential dopant into at least said semiconducting regions, wherein said etch differential dopant comprises Ar, As, P, B, or H.

6. The method of claim 3 wherein said implanting is conducted using an implant energy ranging from about 1 keV to about 100 keV and an implant concentration ranging from about $1 \times 10^{14}$ atoms/cm$^2$ to about $1 \times 10^{17}$ atoms/cm$^2$.

7. The method of claim 1 wherein said removing said etch differential doped portion comprises a highly selective etch process comprising HF:HNO$_3$:CH$_3$COOH, ethylenediamine-pyrocatechol-water, KOH, a mixture of NH$_4$OH/H$_2$O$_2$/H$_2$O, a mixture of HCl/H$_2$O$_2$/H$_2$O or combinations thereof.

8. The method of claim 1 wherein said passivating said exposed Si-containing surfaces provides a passivation layer underlying said upper Si-containing surface of said semiconducting regions, said passivation layer having a thickness ranging from about 30 Å to about 100 Å.

9. The method of claim 8 wherein said passivation layer underlying said upper Si-containing surface is formed via thermal oxidation, said thermal oxidation having an annealing temperature ranging from about 800° C. to 1000° C.

10. The method of claim 1 wherein said forming said trench in said substrate including said semiconducting regions and said insulating regions comprises:
   forming an trench patterned etch mask atop said substrate, wherein said trench patterned etch mask defines a trench region of said substrate; and
   etching said trench region to provide a trench.

11. The method of claim 1 wherein said trench dielectric comprises an oxide, a nitride, or an oxynitride deposited by high density plasma chemical vapor deposition or plasma enhanced chemical vapor deposition.

12. The method of claim 1 wherein said substrate comprises Si, SiGe, SiGeC, SiC, or combinations thereof.

13. A method of forming a layer of Si comprising:
   providing a substrate having semiconducting regions separated by insulating regions;
   forming a block mask protecting a portion of said substrate, where an unprotected portion of said substrate is exposed;
   implanting dopants into said unprotected portion of said substrate to provide an etch differential doped portion in said semiconducting regions underlying an upper Si-containing surface of said semiconducting regions;
   forming a trench in at least said unprotected portion of said substrate including said semiconducting regions and said insulating regions;
   removing said etch differential doped portion from said semiconducting regions to produce a cavity underlying said upper surface of said semiconducting regions; and
   filling said trench with a trench dielectric, wherein said dielectric material encloses said cavity underlying said upper Si-containing surface of said semiconducting regions.

14. The method of claim 13 wherein said upper Si-containing layer has a uniform thickness of less than about 100 Å.

15. The method of claim 13 wherein said implanting dopants into said semiconducting regions comprises ion implanting said etch differential dopant such as Ar, As, P, Ga, H, or B into said semiconducting regions.

16. The method of claim 13 wherein said etching said etch differential doped region comprises a highly selective etch comprising HF:HNO$_3$:CH$_3$COOH, ethylenediamine-pyrocatechol-water, KOH, a mixture of NH$_4$OH/H$_2$O$_2$/H$_2$O, a mixture of HCl/H$_2$O$_2$/H$_2$O or combinations thereof.

17. The method of claim 13 wherein said unprotected portion of said subtract is processed to provide silicon-on-insulator devices and a remaining portion of said substrate is processed to provide bulk-Si devices.

* * * * *